United States Patent [19]

Kuragaki

[11] Patent Number: 5,362,658
[45] Date of Patent: Nov. 8, 1994

[54] METHOD FOR PRODUCING SEMICONDUCTOR DEVICE

[75] Inventor: Takeshi Kuragaki, Itami, Japan

[73] Assignee: Mitsubishi Denki Kabushiki Kaisha, Tokyo, Japan

[21] Appl. No.: 55,865

[22] Filed: May 3, 1993

[30] Foreign Application Priority Data

Oct. 14, 1992 [JP] Japan ................. 4-303088

[51] Int. Cl.5 .......................... H01L 21/265
[52] U.S. Cl. ..................... 437/31; 437/133; 437/160; 437/192; 437/200; 148/DIG. 11
[58] Field of Search ............... 437/31, 133, 192, 200, 437/160, 228; 148/DIG. 11, DIG. 72

[56] References Cited

U.S. PATENT DOCUMENTS

| 4,738,624 | 4/1988 | Iyer et al. | 148/DIG. 11 |
|---|---|---|---|
| 4,824,796 | 4/1989 | Chiu et al. | 437/31 |
| 4,839,303 | 6/1989 | Tully et al. | 437/133 |
| 4,889,831 | 12/1989 | Ishii et al. | 437/133 |
| 5,166,081 | 11/1992 | Inada et al. | 437/133 |
| 5,208,184 | 5/1993 | Bayraktaroglu | 437/31 |
| 5,212,103 | 5/1993 | Shimura | 437/31 |
| 5,217,909 | 6/1993 | Bertagnolli | 437/31 |
| 5,298,439 | 3/1994 | Liu et al. | 437/31 |

Primary Examiner—Tom Thomas
Assistant Examiner—Tuan Nguyen
Attorney, Agent, or Firm—Leydig, Voit & Mayer

[57] ABSTRACT

A method for producing a semiconductor device includes growing a collector layer, a base layer, and an emitter layer on a substrate; forming an emitter electrode, a tungsten film, and a silicon film services as an etching stopper on a prescribed region of the emitter layer; etching the emitter layer using the above-described films as a mask to expose the base layer; forming side walls on opposite side surfaces of the silicon film, tungsten film, emitter electrode, and emitter layer; forming a zinc oxide layer serving as an impurity diffusion source on the base layer and performing a diffusion to produce high purity concentration regions in the base layer; removing the zinc oxide layer by wet etching using hydrofluoric acid as an etchant; depositing a base metal on the base layer and removing an unnecessary portion of the base metal by ion milling for form base electrodes; selectively removing the silicon film; and forming an electrode in contact with the tungsten film. Since the silicon film is not etched by hydrofluoric acid when the zinc oxide layer is removed, the emitter electrode is not adversely affected by the ion milling in removing the base metal, resulting in an HBT with a reliable emitter electrode.

10 Claims, 10 Drawing Sheets

METHOD FOR PRODUCING SEMICONDUCTOR DEVICE

FIELD OF THE INVENTION

The present invention relates to methods for producing semiconductor devices and, more particularly, to methods for producing heterojunction bipolar transistors.

BACKGROUND OF THE INVENTION

FIGS. 5(a) to 5(e) are sectional views illustrating process steps in a conventional method for producing a heterojunction bipolar transistor (hereinafter referred to as HBT).

Initially, an n type GaAs collector layer 2 about 1 micron thick, a p type GaAs base layer 3 about 1000 angstroms thick, and an n type AlGaAs emitter layer 4 about 3000 angstroms thick are successively grown on a semi-insulating GaAs substrate 1 by epitaxial growth. Then, a tungsten silicide (WSi) film 5 4000~5000 angstroms thick is deposited on the emitter layer 4 by sputtering, and an SiO film 6 1000~2000 angstroms thick is deposited on the WSi film 5 by chemical vapor deposition (CVD). Thereafter, the WSi film 5 and the SiO film 6 are patterned in a desired shape by conventional photolithography and reactive ion etching (RIE) using fluorine gas (FIG. 5(a)).

Using the WSi film 5 and the SiO film 6 as a mask, the emitter layer 4 is etched by RIE using $Cl_2$ gas or wet etching using, as an etchant, a mixture of tartaric acid and hydrogen peroxide, leaving portions 41 on the base layer 3 (FIG. 5(b)). The remaining emitter layer 41 has to be as thin as 500 angstroms so that it is sufficiently depleted when the device operates. The etching process of FIG. 5(b) is referred to as a first base etching, hereinafter.

Then, an insulating film, such as SiN, is deposited on the whole surface of the substrate and patterned to form side walls 7. Using the side walls 7 as a mask, the emitter layer is etched to expose the surface of the base layer 3. This etching process is referred to as a second base etching, hereinafter. Thereafter, a base metal 11, such as Ti/Mo/Au, is deposited on the entire surface to a thickness of about 1500 angstroms (FIG. 5(c)).

Then, a photoresist is deposited on the substrate, patterned, and annealed to form a photoresist pattern 12 that covers the surface of the base metal layer 11 except for the emitter region (FIG. 5(d)).

Using the photoresist pattern 12 as a mask, a portion of the base metal layer 11 is removed by sputtering using Ar ions (hereinafter referred to as ion milling), forming base electrodes 111. During the ion milling, the SiO film 6 prevents the WSi film 5 as an emitter electrode from being etched. Then, unnecessary portions of the SiO film 6 and the side walls 7 are removed to complete the structure of FIG. 5(e). The thin portions of the emitter layer 4 remaining under the side walls 7 are depleted when the device operates and prevent generation of a recombination current in that region.

A description is given of the operation.

Generally, a high-speed bipolar transistor is achieved by reducing the base width, but the reduced base width causes an increase in the base resistance. In order to reduce the base resistance, it is necessary to increase the impurity concentration of the base layer. In a bipolar transistor comprising a single material, the increase in the impurity concentration of the base layer decreases the resistance of the whole base layer, so that holes injected from the base to the emitter increase and the current gain decreases. In the HBT, however, the injection of holes from the base to the emitter is suppressed by a difference in energy band gaps between the base and the emitter.

FIG. 6 is an energy band diagram for explaining the above-described operation of the HBT. In FIG. 6, an n type AlGaAs emitter layer (E) is formed on a p type GaAs base layer (B), and the energy band gap of the emitter (E) is wider than the energy band gap of the base (B) and the collector (C). When a forward bias is applied between the base (B) and the emitter (E), electrons in the AlGaAs emitter (E) region are easily injected into the GaAs base (B) region because the potential barrier $\Delta E_1$ is small, but holes in the GaAs base (B) region are hardly injected into the AlGaAs emitter (E) region because of the presence of the large potential barrier $\Delta E_2$. In this case, since the emitter current is an electron injecting current, a high current gain $\beta$ is achieved.

In the HBT shown in FIG. 5(e), if high impurity concentration regions are selectively formed, by ion implantation, in the base layer 3 whereon the base electrodes 111 are present, the base resistance is reduced while maintaining the heterojunction structure. However, since the maximum impurity concentration achieved by the ion implantation is only $4 \times 10^{17}$ cm$^{-3}$, the base resistance is not sufficiently reduced. In addition, the ion implantation adversely affects the base layer.

In order to avoid the above-described problems of the ion implantation, a solid phase diffusion method has been employed to produce the high impurity concentration region in the base layer. FIGS. 7(a) to 7(h) illustrate a method for producing an HBT using the solid phase diffusion method.

The steps illustrated in FIGS. 7(a) and 7(b) are identical to those already described with respect to FIGS. 5(a) and 5(b) and, therefore, do not require repeated description.

As illustrated in FIG. 7(c), an insulating film, such as SiN, is deposited over the substrate and etched to form first side walls 7.

Then, as illustrated in FIG. 7(d), a zinc oxide (ZnO) film 8 is deposited to a thickness of about 1000 angstroms by sputtering and annealed. During the annealing, Zn atoms diffuse into the underlying base layer 3, forming Zn diffused regions 9 having a high impurity concentration of $4 \times 10^{19} \sim 4 \times 10^{20}$ cm$^{-3}$. Since the Zn atoms also diffuse into the thin portions 41 of the n type emitter layer 4, these portions are turned p type. An SiO film about 1000 angstroms thick is sometimes formed on the ZnO film 8 to prevent Zn atoms from diffusing into the atmosphere.

Then, the ZnO film 8 is removed with hydrofluoric acid. At this time, the SiO film 6 and the first side walls 7 are unfavorably removed with the ZnO film 8 as shown in FIG. 7(e). Therefore, second side walls 10 comprising SiN or the like are formed on opposite sides of the emitter layer 4 and the WSi layer 5 (FIG. 7(f)).

Using the second side walls 10 as a mask, the emitter layer 41 is etched to expose the base layer 3 (second base etching). Thereafter, a base metal 11 is deposited on the whole surface of the substrate, and a photoresist is deposited thereon, patterned, and annealed to form a photoresist pattern 12 as shown in FIG. 7(g).

Then, the base metal 11 is selectively removed by ion milling using the photoresist pattern 12 as a mask, forming base electrodes 111. Since the SiO film 6 on the WSi film 5 has been removed in the step of FIG. 7(e), the WSi film 5 is subjected to the ion milling and unfavorably etched as shown in FIG. 7(h).

As described above, when the solid phase diffusion process is applied to the conventional method of producing the HBT, the SiO film 6, which would serve as an etching stopper layer when the base metal is removed by ion milling, is unfavorably removed when the ZnO film 8 is removed with hydrofluoric acid. Therefore, the WSi layer 5, i.e., the emitter electrode, is etched during ion milling. As a result, the resistance of the emitter electrode increases, adversely affecting the electrical characteristics of the HBT.

SUMMARY OF THE INVENTION

It is an object of the present invention to provide a method for producing a semiconductor device in which an emitter electrode is formed with high reliability even if an external base is formed by a solid phase diffusion method including removing a ZnO film.

Other objects and advantages of the present invention will become apparent from the detailed description given hereinafter. The detailed description and specific embodiments are provided for illustration only, since various additions and modifications within the spirit and scope of the invention will become apparent to those of skill in the art from the detailed description.

According to a first aspect of the present invention, in a method for producing a semiconductor device, an Si film is employed as an etching stopper layer for protecting an underlying emitter electrode when a base metal is removed by ion milling. Alternatively, an SiO film covered with Si side walls and a tungsten film is employed as the etching stopper layer. The Si film or the SiO film covered with Si and tungsten is not etched by hydrofluoric acid when a solid phase diffusion source, i.e., zinc oxide, is removed. Therefore, the emitter electrode is not adversely affected by the ion milling in removing the base metal, providing an HBT with a reliable emitter electrode.

According to a second aspect of the present invention, the emitter electrode comprises a metal layer, and opposite side surfaces of the metal layer are oxidized. Therefore, the metal layer is not etched when the emitter layer is etched by chlorine gas. Since the emitter electrode comprises the metal layer, the resistance thereof is reduced.

According to a third aspect of the present invention, after forming base electrodes, a first emitter electrode comprising a metal is removed and then a second emitter electrode comprising another metal is formed. Therefore, the degree of freedom in selecting the material of the emitter electrode increases, resulting in an HBT having an emitter electrode with desired characteristics.

DETAILED DESCRIPTION OF THE PREFERRED EMBODIMENTS

Figure 1:
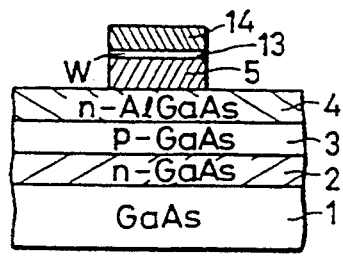
FIGS. 1(a) to 1(l) are sectional views illustrating process steps in a method for producing a semiconductor device in accordance with a first embodiment of the present invention.
Figure 1:
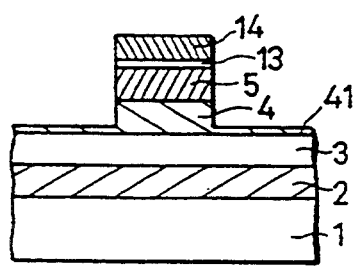
Figure 1:
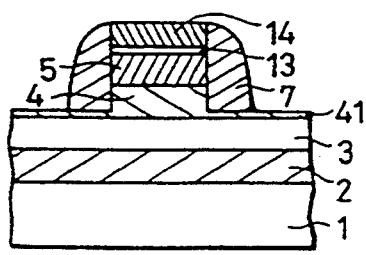
Figure 1:
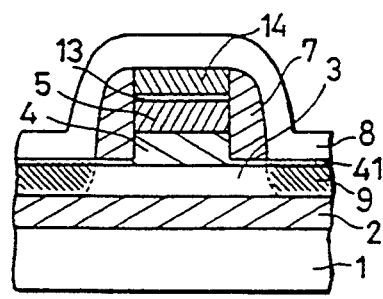
Figure 1:
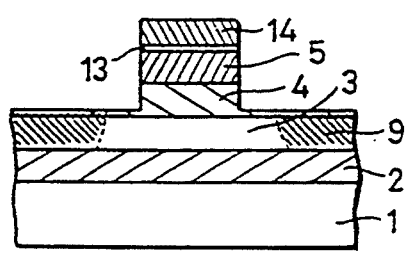
Figure 1:
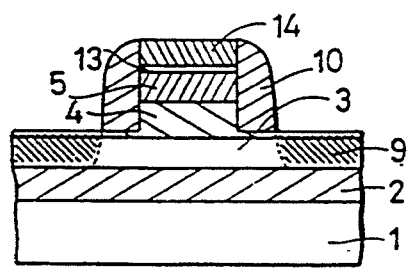
Figure 1:
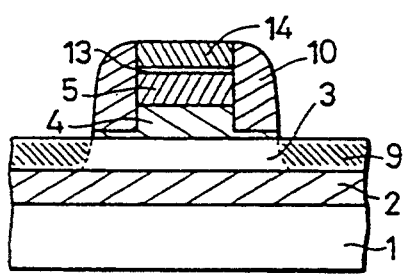
Figure 1:
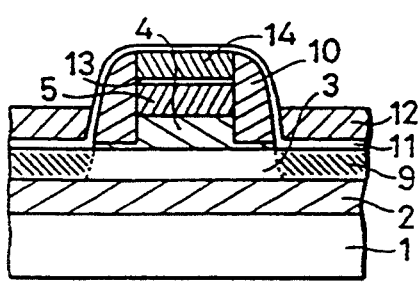
Figure 1:
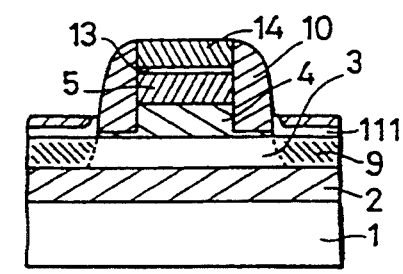
Figure 1:
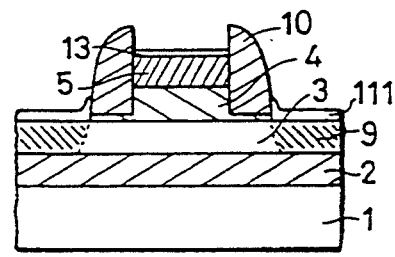
Figure 1:
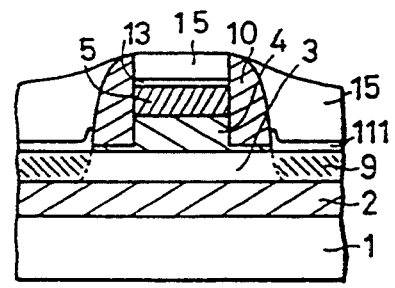
Figure 1:
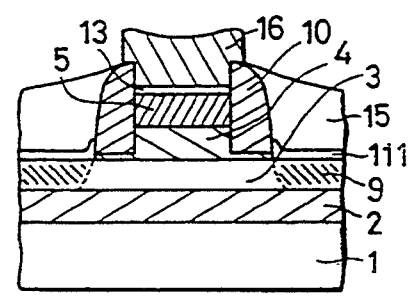

FIGS. 1(a) to 1(l) are sectional views illustrating process steps in a method for producing an HBT in accordance with a first embodiment of the present invention.

Initially, there are successively grown on a semi-insulating GaAs substrate 1 600 microns thick, an n type GaAs collector layer 2 about 1 micron thick, a p type GaAs base layer 3 about 1000 angstroms thick, and an n type AlGaAs emitter layer 4 about 3000 angstroms thick. Then, a WSi film 5 4000~5000 angstroms thick is deposited on the emitter layer 4 by sputtering, and a tungsten (W) film 13 about 300 angstroms thick and an Si film 14 about 1000 angstroms thick are successively grown on the WSi film 5 by CVD. The WSi film 5, the W film 13, and the Si film 14 are patterned in a desired shape by conventional photolithography and RIE using fluorine gas (FIG. 1(a)).

Using the films 5, 13, and 14 as a mask, the emitter layer 4 is etched by RIE using $Cl_2$ gas or wet etching using, as an etchant, a mixture of tartaric acid and hydrogen peroxide, leaving portions 41 on the base layer as shown in FIG. 1(b) (first base etching). The remaining emitter layer 41 has to be as thin as 500 angstroms so that it is sufficiently depleted when the device operates.

After the first base etching, an SiN film is deposited on the whole surface of the substrate and etched to form first side walls 7 (FIG. 1(c)).

Then, a ZnO film 8 is deposited on the whole surface of the substrate and annealed to diffuse Zn atoms into the underlying base layer 3, producing Zn diffused regions 9 in the base layer 3 (FIG. 1(d)). Since the Zn atoms also diffuse the thin portions 41 of the n type emitter layer 4, these portions are turned p type. In this way, the Zn diffused regions 9 having a high impurity concentration of b $4 \times 10^{19} \sim 4 \times 10^{20}$ $cm^{31\ 3}$ are formed in regions of the base layer 3 where base electrodes are to be produced.

Thereafter, the ZnO film 8 is removed by wet etching using hydrofluoric acid. During the etching, the first side walls comprising SiN are also etched away, but the Si film 14 is not etched because it is resistant to hydrofluoric acid (FIG. 1(e)).

Then, an SiN film is deposited on the whole surface of the substrate and etched to form second side walls 10 (FIG. 1(f)).

Using the second side walls 10 as a mask, the thin portions 41 of the emitter layer 4 are etched to expose the underlying Zn diffused regions 9 as shown in FIG. 1(g) (second base etching).

After depositing a base metal 11, such as Ti/Mo/Au, to a thickness of about 1500 angstroms on the whole surface of the substrate, a photoresist is deposited thereon, followed by patterning and annealing, forming a photoresist pattern 12 (FIG. 1(h)).

Using the photoresist pattern 12 as a mask, an unnecessary portion of the base metal film 11 is removed by ion milling using Ar ions (FIG. 1(i)). During the ion milling, the WSi film 5 as an emitter electrode is not etched because the Si film 14 serves as an etching stopper.

After the ion milling, the Si film 14 is removed by RIE using chlorine gas (FIG. 1(j)). Since the W film 13 serves as an etching stopper, the WSi film 5 is not etched.

After depositing an insulating film 15 for flattening by ECR-CVD (Electron Cyclotron Resonance Chemical Vapor Deposition) as shown in FIG. 1(k), a contact hole is formed on the W film 13 by conventional photolithography and RIE, followed by deposition of Au or the like and lift-off forming an electrode 16 (FIG. 1(l)).

According to the first embodiment of the present invention, the Si film 14 is formed on the WSi emitter electrode 5 in place of the SiO film 6 employed in the conventional method. Since the Si film 14 is not etched when removing the ZnO film 8 with hydrofluoric acid, it can serve as an etching stopper layer during etching of the base metal 11 by ion milling. Therefore, the WSi emitter electrode 5 underlying the Si film 14 is not adversely affected by the ion milling, resulting in a reliable emitter electrode that makes a reliable contact with the electrode 16. As a result, an HBT with low base resistance and stable characteristics is achieved.

FIGS. 2(a) to 2(k) are sectional views illustrating process steps in a method for producing an HBT in accordance with a second embodiment of the present invention. In this second embodiment, an SiO film is formed on the WSi film, and serves as an etching stopper when base electrodes are formed by ion milling. The top surface and side surfaces of the SiO film are covered with a W film and Si side walls, respectively.

The production method will be described in more detail.

Initially, a collector layer 2, a base layer 3, and an emitter layer 4 are successively grown on a semi-insulating GaAs substrate 1 epitaxially. Then, a WSi film 5 as an emitter electrode, an SiO film 6 as an etching stopper, and a W film 13 about 300 angstroms thick are formed on the emitter layer 4 and patterned by conventional photolithography and RIE using fluorine gas (FIG. 2(a)).

Figure 2:
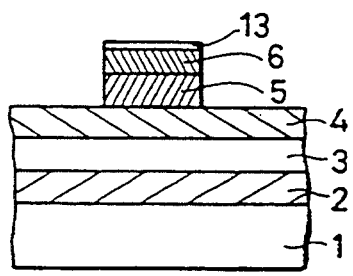
FIGS. 2(a) to 2(k) are sectional views illustrating process steps in a method for producing a semiconductor device in accordance with a second embodiment of the present invention.
Figure 2:
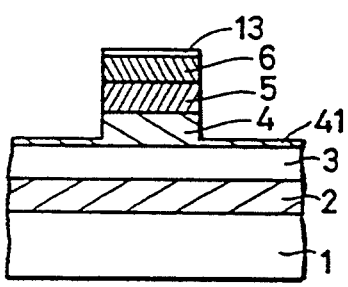
Figure 2:
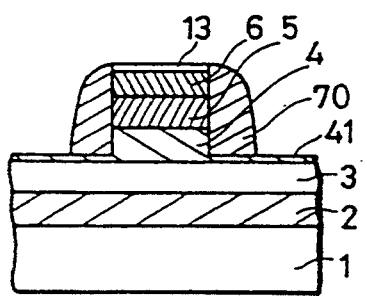
Figure 2:
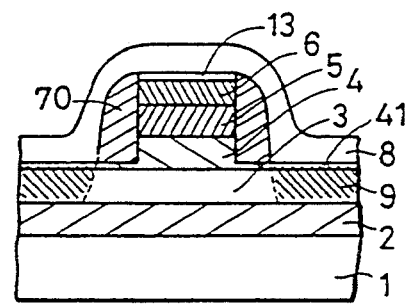
Figure 2:
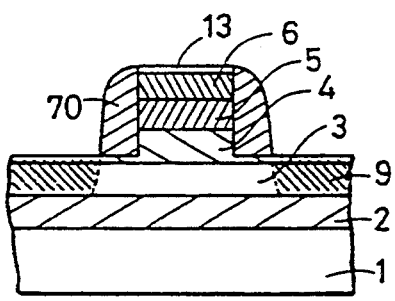
Figure 2:
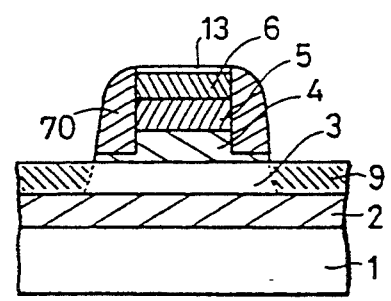
Figure 2:
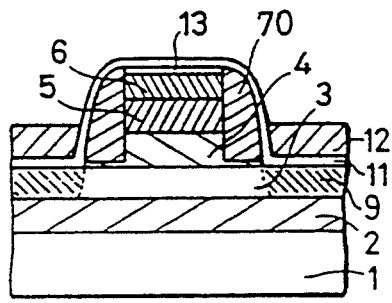
Figure 2:
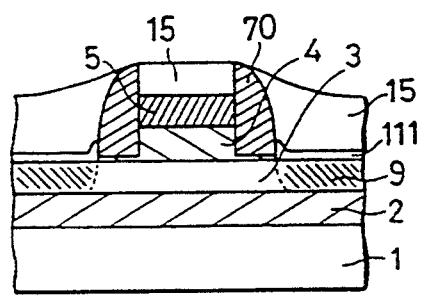
Figure 2:
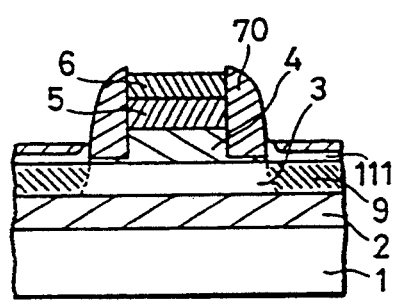
Figure 2:
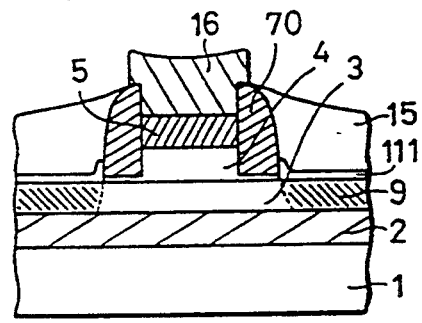
Figure 2:
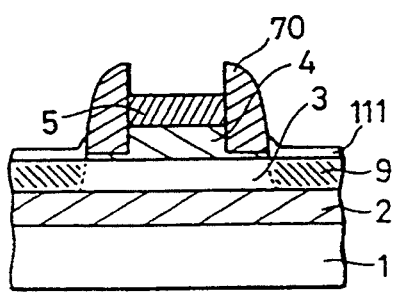

Using the WSi film 5, SiO film 6, and W film 13 as a mask, the emitter layer 4 is etched as shown in FIG. 2(b) (first base etching).

Then, an Si film is deposited on the whole surface of the substrate by sputtering or CVD and etched by RIE to form side walls 70. The substrate is exposed to a hydrogen plasma to terminate dangling bonds, improving the insulating property of the side walls 70.

In FIG. 2(d), a ZnO film 8 as an impurity diffusion source is formed on the whole surface of the substrate by sputtering or the like and annealed to diffuse Zn atoms into the underlying base layer 3, forming Zn diffused regions 9 in the base layer 3.

In FIG. 2(e), the ZnO film 8 is etched away by hydrofluoric acid. During the etching, the SiO film 6 is not etched because it is covered with the Si side walls 70 and the W film 13.

Using the side walls 70 as a mask, a second base etching is carried out as shown in FIG. 2(f).

Thereafter, a base metal 11, such as Ti/Mo/Au, is deposited on the whole surface of the substrate and selectively masked with a photoresist pattern 12 (FIG. 2(g)).

In FIG. 2(h), an unmasked portion of the base metal 11 is removed by ion milling. During the ion milling, the W film 13 about 300 angstroms thick is also removed.

After removing the SiO film 6 as shown in FIG. 2(i), an insulating film 15 for flattening is deposited on the substrate by ECR-CVD (FIG. 1(j)). Then, a contact hole is formed on the WSi film 5 by conventional photolithography and RIE, followed by deposition of Au or the like and lift-off, forming an electrode 16 (FIG. 1(k)).

In this second embodiment, since the side walls 70 remain during etching of the ZnO film 8, it is not necessary to form the side walls again, reducing the number of the process steps.

FIGS. 3(a) to 3(l) are sectional views illustrating process steps in a method for producing an HBT in accordance with a third embodiment of the present invention. In this third embodiment, an emitter electrode comprising a metal is formed on the emitter layer, the top surface of the emitter electrode is covered with an Si film, and side surfaces of the emitter electrode are oxidized.

The production method will be described in more detail.

After epitaxially growing a collector layer 2, a base layer 3, and an emitter layer 4 on a semi-insulating GaAs substrate 1, an Al film 17 3000~4000 angstroms thick is deposited on the emitter layer 4 by vapor deposition or sputtering, and a tungsten film 13 about 300 angstroms thick and an Si film 14 about 1000 angstroms thick are successively deposited thereon. These films 17, 13, and 14 are patterned as shown in FIG. 3(a) by conventional photolithography and RIE using fluorine gas or chlorine gas.

The substrate is subjected to an $O_2$ plasma or anodic oxidation to oxidize the side surfaces of the Al film 17, forming oxide films (alumina: $Al_2O_3$) 171 (FIG. 3(b)).

Figure 3:
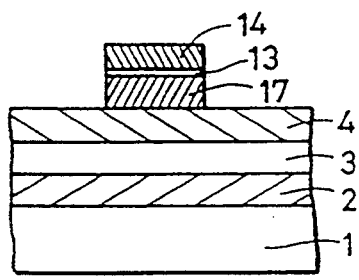
FIGS. 3(a) to 3(l) are sectional views illustrating process steps in a method for producing a semiconductor device in accordance with a third embodiment of the present invention.
Figure 3:
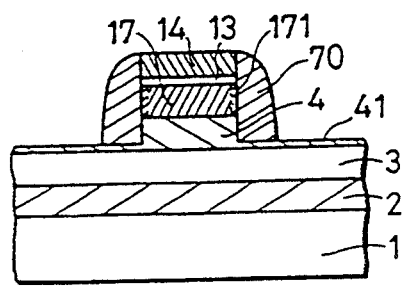
Figure 3:
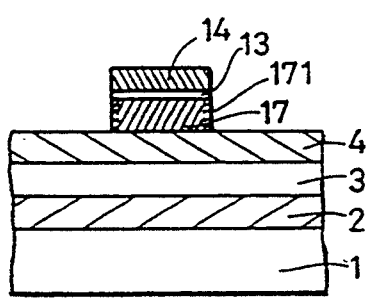
Figure 3:
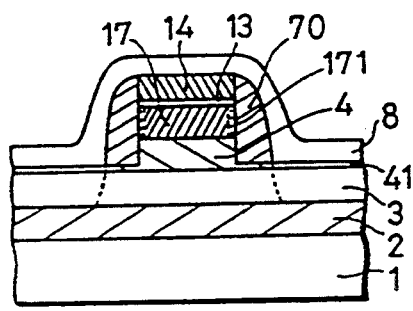
Figure 3:
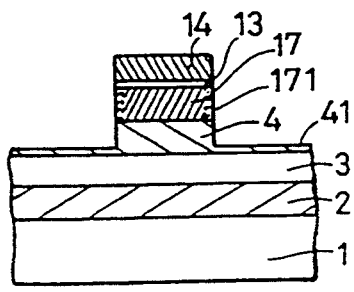
Figure 3:
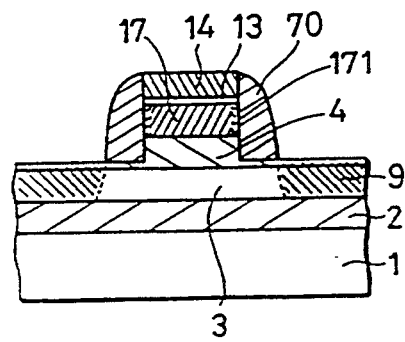
Figure 3:
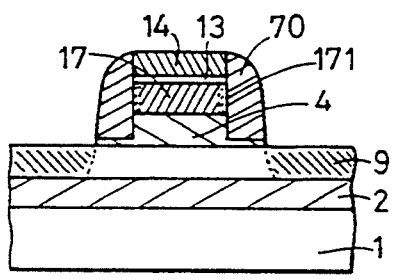
Figure 3:
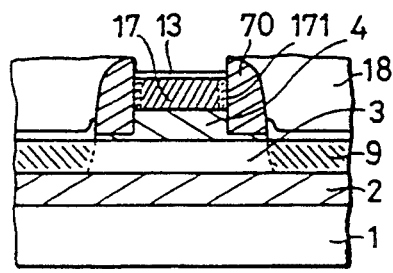
Figure 3:
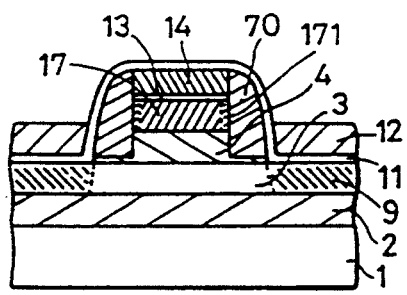
Figure 3:
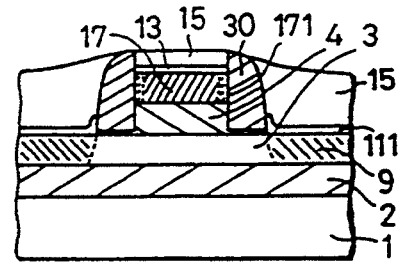
Figure 3:
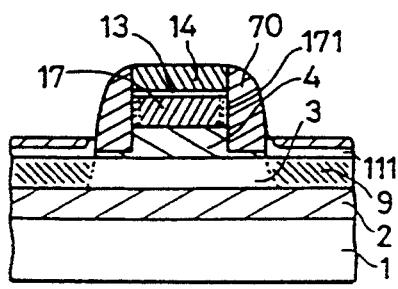
Figure 3:
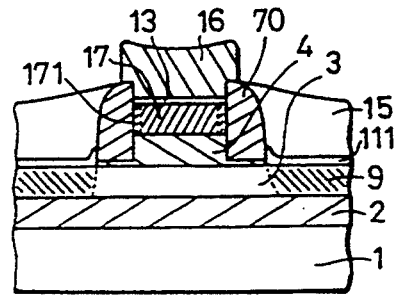

Using the Al film 17, W film 13, and Si film 14 as a mask, the emitter layer 4 is etched as shown in FIG. 3(c) (first base etching). Since the oxide films 171 are present on opposite sides of the Al film 17, RIE with chlorine gas is usable for the first base etching.

Then, first side walls 70 comprising Si are formed as shown in FIG. 3(d).

Then, as shown in FIG. 3(e), a ZnO film 8 is deposited on the whole surface of the substrate by sputtering or the like and annealed to diffuse Zn atoms into the underlying base layer 3, forming Zn diffused regions 9 in the base layer 3 where base electrodes are to be formed. During the annealing, the thin portions 41 of the emitter layer remaining on the base layer 3 are turned p type.

Thereafter, the ZnO film 8 is removed by wet etching using hydrofluoric acid (FIG. 3(f)). During the etching, the Si side walls 70 and the Si film 14 are not etched.

Using the first side walls 70 as a mask, the thin portions 41 of the emitter layer are removed as shown in FIG. 3(g) (second base etching).

Then, a base metal 11, such as Ti/Mo/Au, is deposited as shown in FIG. 3(h), and an unnecessary portion of the base metal is removed by ion milling using a photoresist pattern 12 as a mask, producing the structure of FIG. 3(i). Then, a photoresist 18 is deposited on opposite sides of the side walls 70, and the Si film 14 is removed by RIE using chlorine gas (FIG. 3(j)). During the RIE, since the tungsten film 13 serves as an etching stopper, the Al film 17 is not etched.

After removing the photoresist 18, an insulating film 15 for flattening is deposited by ECR-CVD as shown in FIG. 3(k). Then, a contact hole is formed on the Al film 17 as an emitter electrode by conventional photolithography and RIE, followed by a deposition of Au or the like and lift-off, forming an electrode 16 (FIG. 1(l)).

According to the third embodiment of the present invention, the Al film 17 is used as the emitter electrode, and the oxide films 171 are formed at opposite sides of the Al film 17 so that the Al film 17 is not etched during the first base etching. Since the Al film is used as the emitter electrode, the electrode resistance of the HBT is reduced as compared with the conventional HBT using the silicide film as the emitter electrode.

FIGS. 4(a) to 4(f) are sectional views illustrating process steps in a method for producing an HBT according to a fourth embodiment of the present invention. In this embodiment, after forming the base electrodes, the side walls 70, Si film 12, tungsten film 13, and Al film 17 are removed, and an emitter electrode comprising a metal other than Al is formed.

The production method will be described in more detail.

Figure 4:
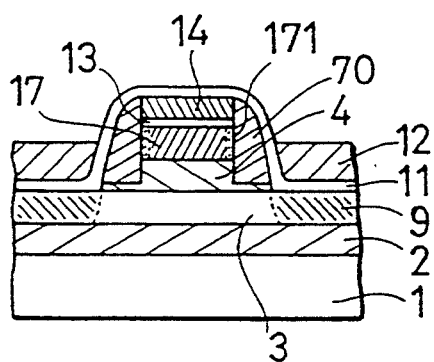
FIGS. 4(a) to 4(f) are sectional views illustrating process steps in a method for producing a semiconductor device in accordance with a fourth embodiment of the present invention.
Figure 4:
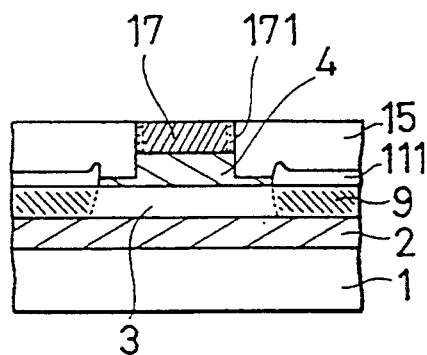
Figure 4:
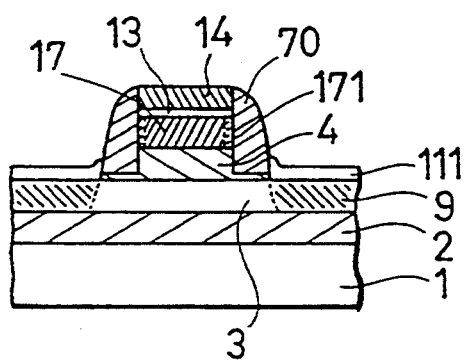
Figure 4:
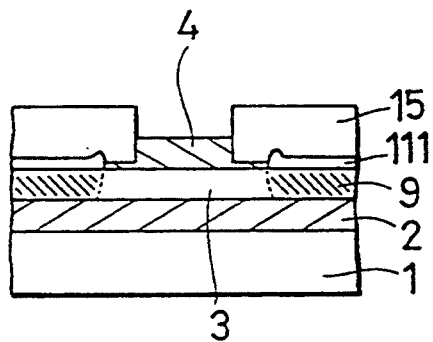
Figure 4:
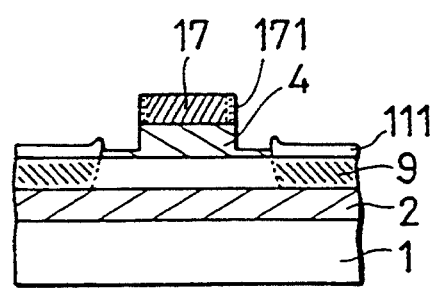
Figure 4:
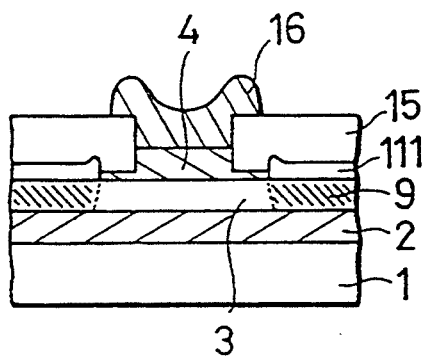
Figure 5:
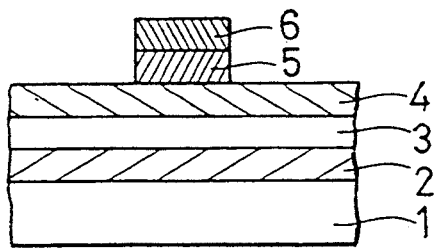
FIGS. 5(a) to 5(e) are sectional views illustrating process steps in a method for producing a semiconductor device in accordance with the prior art.
Figure 5:
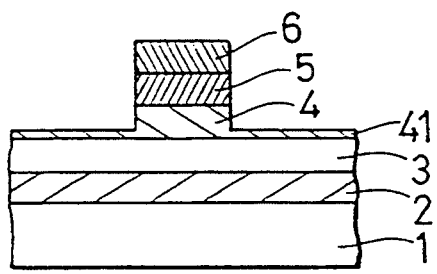
Figure 5:
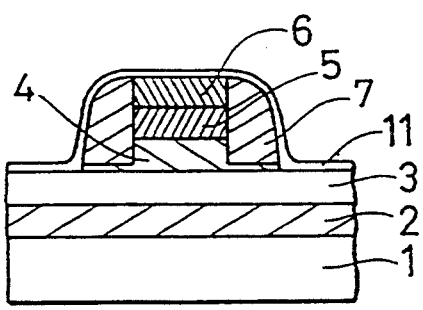
Figure 5:
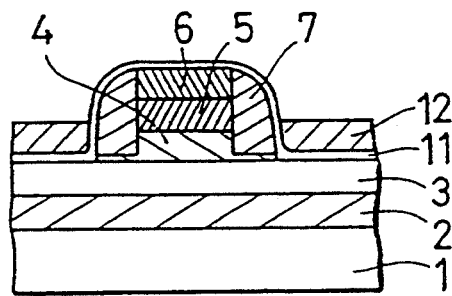
Figure 5:
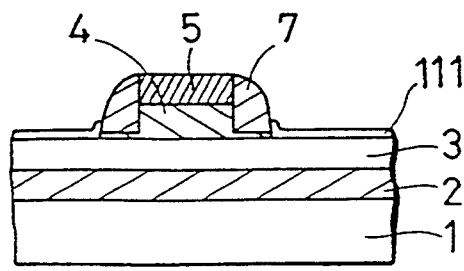
Figure 6:
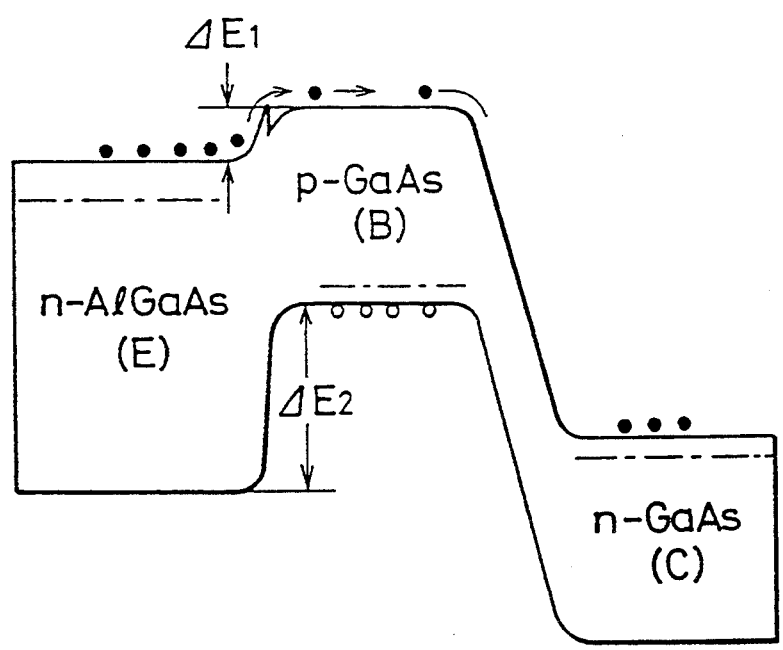
FIG. 6 is an energy band diagram for explaining an operation of a semiconductor device in accordance with the prior art.
Figure 7:
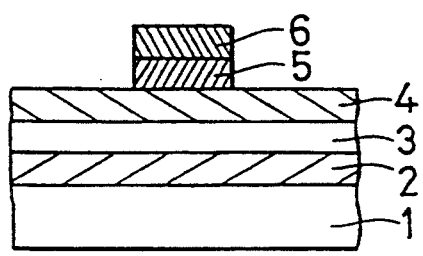
FIGS. 7(a) to 7(h) are sectional views illustrating process steps in a method for producing a semiconductor device using a solid phase diffusion method in accordance with the prior art.
Figure 7:
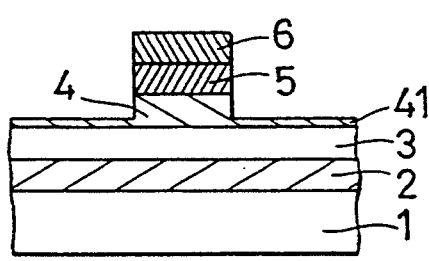
Figure 7:
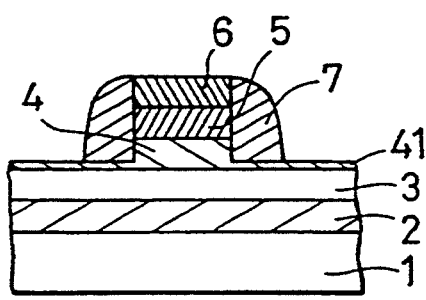
Figure 7:
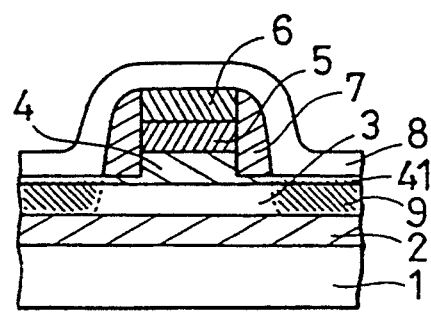
Figure 7:
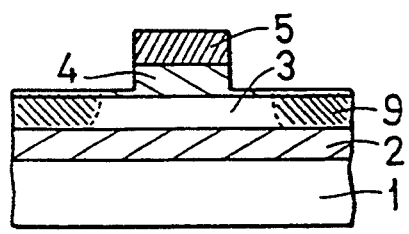
Figure 7:
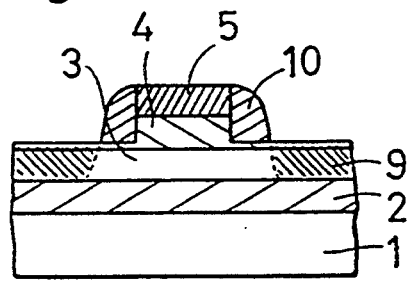
Figure 7:
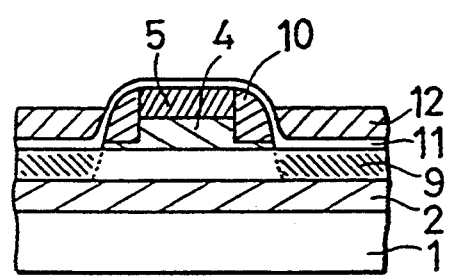
Figure 7:
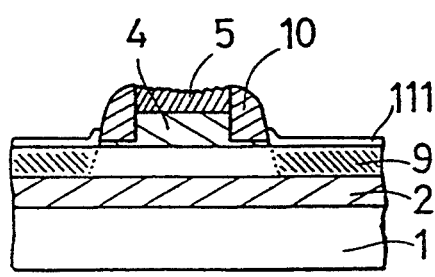

The structure of FIG. 4(a) is attained according to the process steps described with respect to FIGS. 3(a) to 3(h). That is, after depositing a base metal 11 comprising, for example, Ti/Mo/Au, a photoresist is deposited thereon, patterned, and annealed, forming a photoresist pattern 12.

In FIG. 4(b), using the photoresist pattern 12 as a mask, an unnecessary portion of the base metal 11 is removed by ion milling, forming base electrodes 111.

In FIG. 4(c), the first side walls 70, the Si film 14, and the W film 13 are removed by RIE using fluorine gas.

An insulating film 15 for flattening is deposited by ECR-CVD (FIG. 4(d)), and the Al film 17 is removed by etching using hydrochloric acid (FIG. 4(e)).

Finally, an emitter electrode 16 comprising Ti is formed on the emitter layer 4 by conventional deposition and lift-off.

In this fourth embodiment, the degree of freedom in selecting the material of the emitter electrode increases. Since it is possible to increase the thickness of the emitter electrode 16, the electrode resistance is reduced. Since the emitter electrode 16 is directly in contact with the emitter layer 4, the surface of the device is flattened.

While in the above-described embodiments the thin portions 41 of the emitter layer 4 remaining on the base electrode production regions are removed by the second base etching after the Zn diffusion, the thin portions 41 may be left because these portions are turned p type by the Zn diffusion. In this case, the second base etching can be dispensed with.

While in the above-described embodiments the thin portions 41 of the emitter layer 4 are left in the first base etching, the emitter layer 4 may be etched until the surface of the base layer 3 is exposed in the first base etching if the etching precision can be ignored. In this case, the second base etching can be dispensed with.

What is claimed is:

1. A method for producing a semiconductor device comprising:

successively growing a collector layer, a base layer, and an emitter layer on a semi-insulating semiconductors substrate;

forming an emitter electrode, a tungsten film, and a silicon film serving as an etching stopper on a region of said emitter layer;

etching and removing part of said emitter layer using, as a mask, said silicon film, said tungsten film, and said emitter electrode;

forming side walls on and contacting said silicon film, said tungsten film, said emitter electrode, and parts of said emitter layer;

forming a zinc oxide layer serving as a dopant impurity diffusion source on remaining parts of said emitter layer and performing a diffusion to diffuse zinc from said zinc oxide layer through remaining parts of said emitter layer and into said base layer to produce high dopant impurity concentration regions in said base layer;

removing said zinc oxide layer by wet etching;

removing the remaining parts of said emitter layer through which zinc was diffused into said base layer to expose said base layer where zinc was diffused into said base layer;

depositing a base metal on said base layer to form base electrodes;

selectively removing said silicon film to expose said tungsten film; and forming an electrode in contact with said tungsten film.

2. The method of claim 1 including:

removing said side walls together with said zinc oxide layer in the wet etching step; and after removing said zinc oxide layer and before removing the remaining parts of said emitter layer through which zinc was diffused into said base layer, forming second side walls comprising SiN on and contacting the remaining parts of said emitter layer, said emitter electrode, said tungsten film, and said silicon film.

3. The method of claim 1 including employing a first metal layer as said emitter electrode and, before etching said emitter layer, oxidizing exposed surfaces of said first metal layer to form oxide films.

4. The method of claim 3 including:

removing said side walls, said tungsten film, and said silicon film to expose said emitter electrode;

removing said emitter electrode; and forming a second emitter electrode comprising a second metal different from said first metal.

5. A method for producing a semiconductor device comprising:

successively growing a collector layer, a base layer, and an emitter layer on a semi-insulating semiconductor substrate;

forming an emitter electrode, an SiO film serving as an etching stopper, and a tungsten film on a region of said emitter layer;

etching and removing part of said emitter layer using, as a mask, said tungsten film, said SiO film, and said emitter electrode;

forming side walls comprising Si on and in contact with said tungsten film, said SiO film, said emitter electrode, and remaining parts of said emitter layer;

forming a zinc oxide layer serving as a dopant impurity diffusion source on remaining parts of said emitter layer and performing a diffusion to diffuse zinc from said zinc oxide layer through remaining parts of said emitter layer and into said base layer to produce high dopant impurity concentration regions in said base layer;

removing said zinc oxide layer by wet etching;

removing the remaining parts of said emitter through which zinc was diffused into said base layer to expose said base layer where zinc was diffused into said base layer;

depositing a base metal on said base layer to form base electrodes;

removing parts of said base metal and said tungsten film;

removing said SiO film to expose said emitter electrode; and forming a second electrode in contact with said emitter electrode.

6. A method for producing a semiconductor device comprising:

successively growing a collector layer, a base layer, and an emitter layer on a semi-insulating semiconductor substrate;

forming an emitter electrode, a tungsten film, and a silicon film serving as an etching stopper on a region of said emitter layer;

etching and removing part of said emitter layer using, as a mask, said silicon film, said tungsten film, and said emitter electrode to expose said base layer;

forming side walls on and contacting said silicon film, said tungsten film and said emitter electrode;

forming a zinc oxide layer serving as a dopant impurity diffusion source on said base layer and performing a diffusion to diffuse zinc from said zinc oxide layer into said base layer to produce high dopant impurity concentration regions in said base layer;

removing said zinc oxide layer by wet etching;

depositing a base metal on said base layer to form base electrodes;

selectively removing said silicon film to expose said tungsten film; and forming an electrode in contact with said tungsten film.

7. The method of claim 6 including:

removing said side walls together with said zinc oxide layer in the wet etching step; and after removing said zinc oxide layer, forming second side walls comprising SiN on and contacting said emitter electrode, said tungsten film, and said silicon film.

8. The method of claim 6 including employing a first metal layer as said emitter electrode and, before etching said emitter layer, oxidizing exposed surfaces of said first metal layer to form oxide films.

9. The method of claim 8 including:

removing said side walls, said tungsten film, and said silicon film to expose said emitter electrode;

removing said emitter electrode; and forming a second emitter electrode comprising a second metal different from said first metal.

10. A method for producing a semiconductor device comprising:

successively growing a collector layer, a base layer, and an emitter layer on a semi-insulating semiconductor substrate;

forming an emitter electrode, an SiO film serving as an etching stopper, and a tungsten film on a region of said emitter layer;

etching and removing part of said emitter layer using, as a mask, said tungsten film, said SiO film, and said emitter electrode to expose said base layer;

forming side walls comprising Si on and in contact with said tungsten film, said SiO film, said emitter electrode, and said emitter layer;

forming a zinc oxide layer serving as a dopant impurity diffusion source on said base layer and performing a diffusion to diffuse zinc from said zinc oxide layer into said base layer to produce high dopant impurity concentration regions in said base layer;

removing said zinc oxide layer by wet etching;

depositing a base metal on said base layer to form base electrodes;

removing parts of said base metal and said tungsten film;

removing said SiO film to expose said emitter electrode; and forming a second electrode in contact with said emitter electrode.

* * * * *